United States Patent
Jang

[11] Patent Number: 5,856,230
[45] Date of Patent: Jan. 5, 1999

[54] METHOD FOR MAKING FIELD OXIDE OF SEMICONDUCTOR DEVICE

[75] Inventor: Se Aug Jang, Ichon, Rep. of Korea

[73] Assignee: Hyundai Electronics Industries Co., Ltd., Kyoungki-do, Rep. of Korea

[21] Appl. No.: 963,589

[22] Filed: Nov. 4, 1997

[30] Foreign Application Priority Data

Dec. 31, 1996 [KR] Rep. of Korea .................. 96-80266

[51] Int. Cl.⁶ .................................................. H01L 21/76
[52] U.S. Cl. ........................ 438/439; 438/448; 438/928; 438/938
[58] Field of Search .................................. 438/439, 444, 438/928, 229, 230, 938, 448

[56] References Cited

U.S. PATENT DOCUMENTS 5,212,111  5/1993  Doan et al. .

FOREIGN PATENT DOCUMENTS 6-275610  9/1994  Japan .

*Primary Examiner*—George R. Fourson
*Attorney, Agent, or Firm*—Gary M. Nath; Nath & Associates

[57] ABSTRACT

There is disclosed a method for making a field oxide, by which wafer warpage is minimized when a local oxidation of silicon process is applied for a large wafer. A material layer having a compressive stress and a nitride are laminated over the back side of a wafer, so that the compressive stress of the material layer complementarily interacts with the tensile stress of the nitride.

6 Claims, 6 Drawing Sheets

METHOD FOR MAKING FIELD OXIDE OF SEMICONDUCTOR DEVICE

BACKGROUND OF THE INVENTION

1. Field of the Invention

The present invention relates, in general, to a method for making a field oxide of a semiconductor device and, more particularly, to a local oxidation of silicon (hereinafter referred to as "LOCOS") process by which the wafer warpage of a large wafer is minimized.

2. Description of the Prior Art

A LOCOS process is one of the typical methods for making a field oxide. According to the process, a pad oxide and a silicon nitride are sequentially laminated over a substrate, a predetermined region of the nitride is removed and the substrate is oxidized at the predetermined region, to form a field oxide.

Since such LOCOS process is simple and is found to cause much fewer defects compared with other processes, it is the most widely used for mass production. However, the LOCOS process cannot be directly applied for highly integrated devices because it has the significant problem of a long bird's beak. To avoid this bird's beak problem, a modified LOCOS process has been recently developed, in which the substrate is etched at the nitride-removed region to a predetermined thickness to form a trench or groove at which a subsequent oxidation process is proceeded.

Today, wafers with large diameters are employed in order to increase productivity. However, new problems other than the bird's beak occur in the LOCOS process when using a wafer 200 mm (8 inches) or greater in size. One of the most representative examples is wafer warpage (an index indicating crookedness). Wafer warpage is not problematic at all for the wafers as small as 150 mm (6 inches), but arises for large-sized wafers.

In FIG. 1, wafer warpage which is generated while a field oxide is formed on a wafer 200 mm or greater in diameter is shown. In the course of forming a field oxide in a LOCOS process, pad oxides 2 and 2' are thermally grown on the front and the back sides of a wafer 1 and nitrides 3 and 3', resistant to oxidation, are deposited in a low pressure chemical vapor deposition (LPCVD) technique. These LPCVD nitrides are formed on the front side F and the back side B, at once. Subsequently, the nitride 3 on the front side is locally removed at predetermined field regions by an etching process. As seen, the nitride 3 on the front side F is partly removed and separated like islands whereas the nitride on the back side B remains continuous. At this time, this continuous nitride strongly exerts its tensile stress on the back side of the wafer, making the wafer bend (wafer warpage). This wafer warpage is more serious as the diameter of the wafer is larger.

To solve such wafer warpage as occurs owing to the above-mentioned mechanism, a plasma enhanced CVD (PECVD) technique was developed by which a nitride was deposited on the front side only. However, a PECVD nitride cannot be used in practical element-isolation processes because it is far inferior to an LPCVD nitride in various film properties including oxidation resistance.

With reference to FIG. 2, there are data of an experiment in which wafer warpage is measured according to the thicknesses of a nitride used as an element-isolating mask in a wafer 200 mm in diameter. From the data, wafer warpage is found to be largely modulated by the diameter of a wafer as well as the thickness of the nitride deposited. Just after the deposition of nitride (B), there is a valence between the stresses on the front and the back sides, so that slight warpage forms and is little changed with the thickness of nitride. However, after the nitride at the field regions on the front side is removed (A), warpage is 2–3 folds increased and is aggravated by the thickness of nitride. In particular, when the deposited nitride is thicker than 1,500 Angstrom, warpage is abruptly raised.

The following are the problems of large wafer warpage.

First, if a wafer is bent, a significant misalignment in the photo processes which proceed after the element isolation process occurs and the uniformity in critical dimension (CD) is lowered among the dies within the wafer.

In addition, when a gate oxide is formed after the element isolation process, a bent wafer gives poor properties to the gate oxide.

FIG. 3, shows a bar graph. It is obtained from an experiment in which a property of the gate oxide formed on a 200 mm wafer following the element-isolation process is investigated while the nitride to be used in the element-isolation process is changed in thickness from 1000 to 2500 Angstrom. The Y axis shows the percentage ratio of the die number of good gate oxide to the total die number. The data demonstrated that the die number of good gate oxide is reduced as the nitride is thicker. This is attributed to the fact that the wafer warpage increases with the thickness of the nitride.

As apparent from the data, the thickness of the nitride should be not more than 1500 Angstrom in order to improve the reliability of the gate oxide. In this case, however, another problem occurs in practice. One of the most important requirements for the element isolation process is to shorten the bird's beak. The length of the bird's beak of field oxide formed in LOCOS process is sensitively affected by the thickness of the nitride. That is, the reduction of the thickness of the nitride into a critical value is disadvantageous in the aspect of the bird's beak.

SUMMARY OF THE INVENTION

Therefore, it is an object of the present invention to overcome the above problems encountered in prior arts and to provide a method for making a field oxide, by which wafer warpage is minimized when using a LOCOS process for a large wafer even while a nitride, acting as an element isolating mask, is thickly formed.

The above object could be accomplished by a provision of a method for making a field oxide, comprising the steps of: forming a compressive stress layer over the back side of a silicon wafer; laminating a pad oxide and a nitride over the front side and the back side of the wafer; etching the nitride and pad oxide selectively at a predetermined field region over the front side of the wafer; and oxidizing the wafer at the field region, to grow a field oxide.

In accordance with another object of the present invention, a method for making a field oxide is provided, comprising the steps of: forming a compressive stress layer over the back side of a silicon wafer; laminating a pad oxide and a nitride over the front side and the back side of the wafer; etching the nitride and pad oxide selectively at a predetermined field region over the front side of the wafer; forming a spacer at the side wall of the nitride and etching the wafer at the exposed field region to form a groove; and oxidizing the wafer at the field region, to grow a field oxide.

BRIEF DESCRIPTION OF THE DRAWINGS

The above and other objects and aspects of the invention will become apparent from the following description of embodiments with reference to the accompanying drawings in which.

DETAILED DESCRIPTION OF THE PREFERRED EMBODIMENTS

Figure 1:
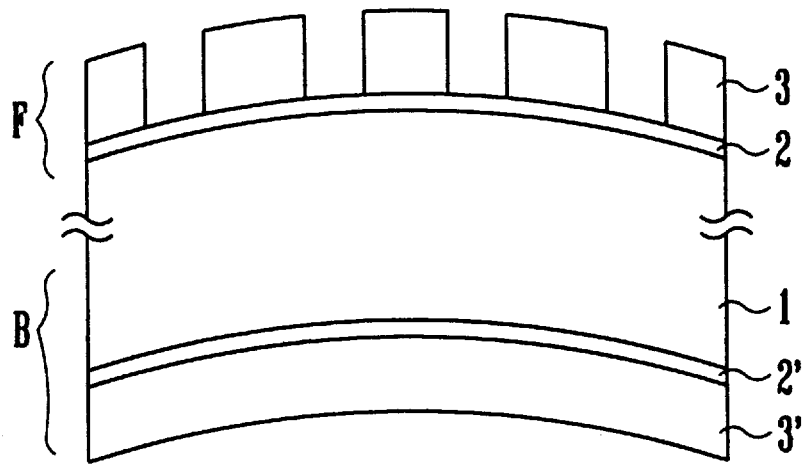
FIG. 1 is a schematic cross sectional view showing that wafer warpage occurs.
Figure 2:
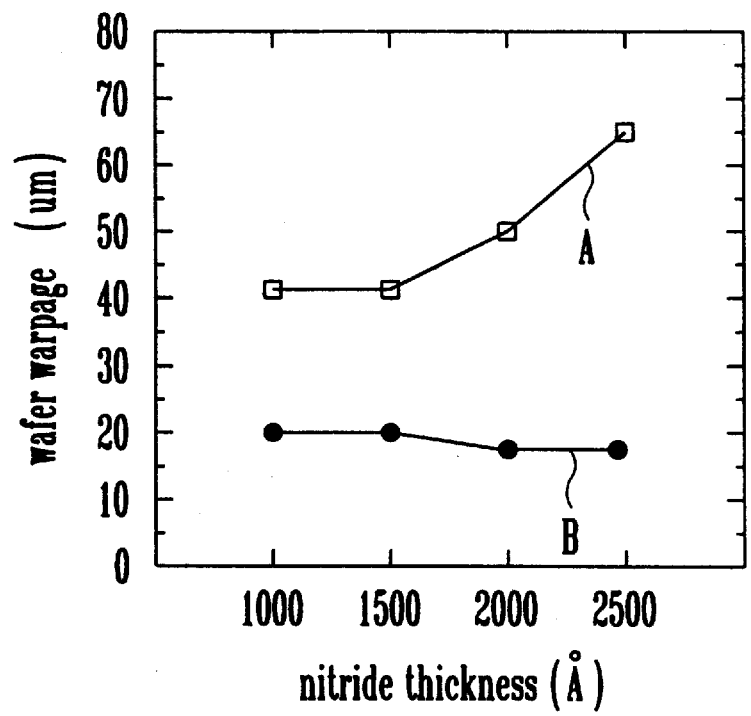
FIG. 2 shows wafer warpage plotted against the thickness of nitride after the nitride over the front side of a wafer is selectively removed (A) and just after the nitride is deposited (B)
Figure 3:
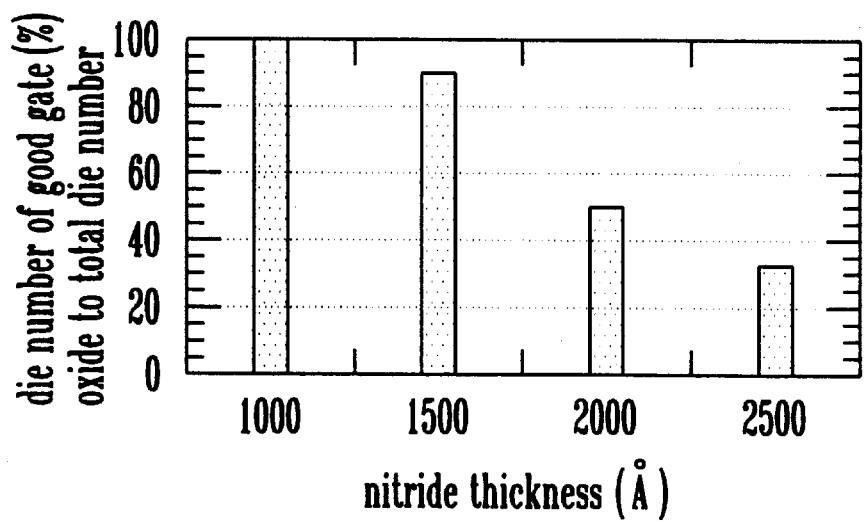
FIG. 3 shows the change in gate oxide die number with the thickness of the nitride after the element isolation process.

The application of the preferred embodiment of the present invention is best understood with reference to the accompanying drawings, wherein like reference numerals are used for like and corresponding parts, respectively.

Referring to FIG. 4, a method for making a field oxide in accordance with the present invention is illustrated.

Figure 4A:
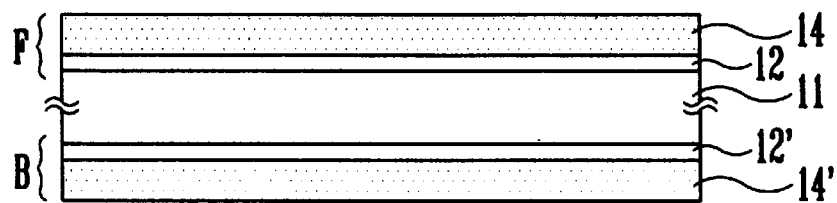
FIGS. 4a through 4h are schematic cross sectional views showing a LOCOS process of making a field oxide after the deposition of a polysilicon layer over the back side of a wafer, in accordance with the present invention.

First, as shown in FIG. 4a, a wafer is oxidized to grow oxides 12 and 12' on the front side and the back side of the wafer, respectively and then, materials of compressive stress, herein, polysilicon layers 14 and 14' are deposited on the oxides. For the deposition of the polysilicon layers 14 and 14', a low pressure chemical deposition (LPCVD) technique is employed. The polysilicon layer 14 ranges, in thickness, from about 500 to 3,000 Angstrom while the oxide 12 is so thick as not to be exhausted upon dry-etching the polysilicon layer, preferably ranging from about 500 to 3,000 Angstrom.

Figure 4B:
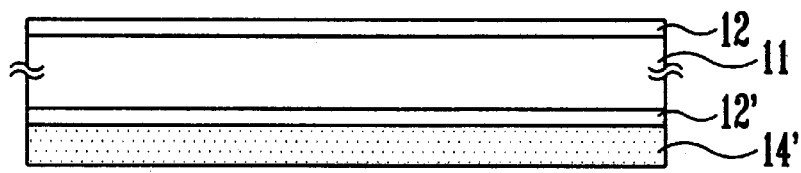

FIG. 4b is a cross section after the polysilicon film 14 over the front side of the wafer is removed in an anisotropic dry-etching process. At the moment, the oxide 12 serves as an etch stopper lest the wafer 11 is damaged.

Figure 4C:
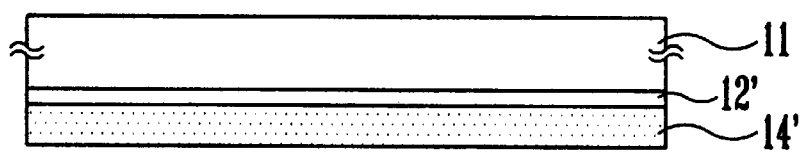

FIG. 4c is a cross section after the exposed oxide 12 on the front side of the wafer is removed in a wet-etching process using hydrofluoride (HF) as an etchant.

Figure 4D:
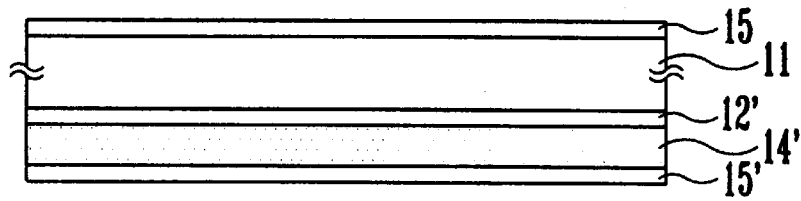

Thereafter, a pad oxide 15 is formed at a predetermined thickness on the front side of the wafer 11, as shown in FIG. 4d. At this time, an oxide 15' is also formed on the polysilicon layer 14' but does not exert any influence on the element isolation process.

Figure 4E:
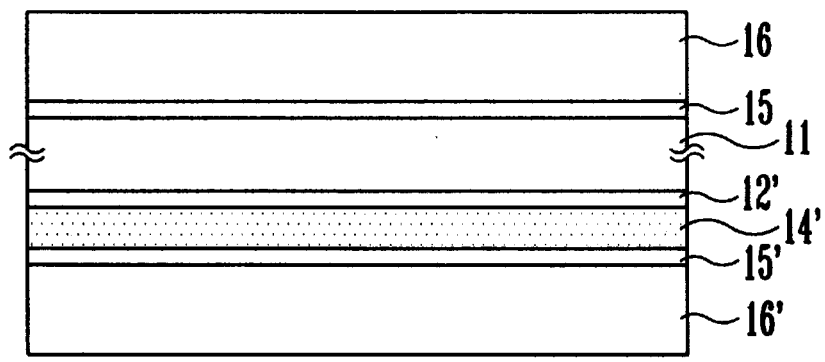

FIG. 4e is a cross section after nitrides 16 and 16' are deposited on the oxides 15 and 15', respectively. The nitrides are used as element isolating masks and formed at a predetermined thickness in an LPCVD technique.

Figure 4F:
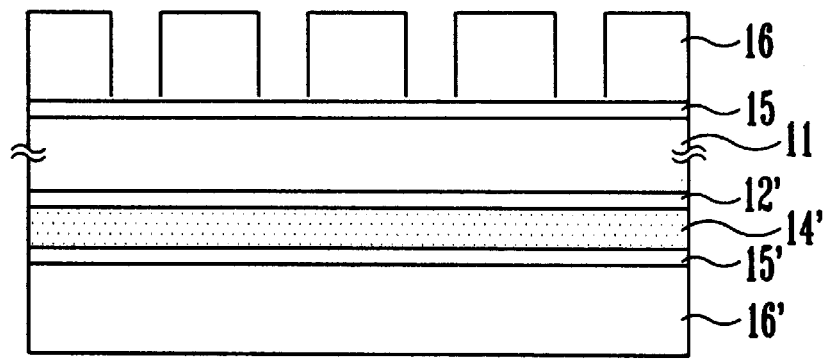

FIG. 4f is a cross section after the nitride 16 over the front side is locally removed by an etching process, to form a nitride pattern. The removed parts of the nitride are correspondent to the field regions. Meanwhile, in the back side of the wafer, the compressive stress of the polysilicon layer 14' complementarily interacts with the tensile stress of the nitride 16', so that wafer warpage does not occur even if the nitride 16 over the front side is locally removed.

Figure 4G:
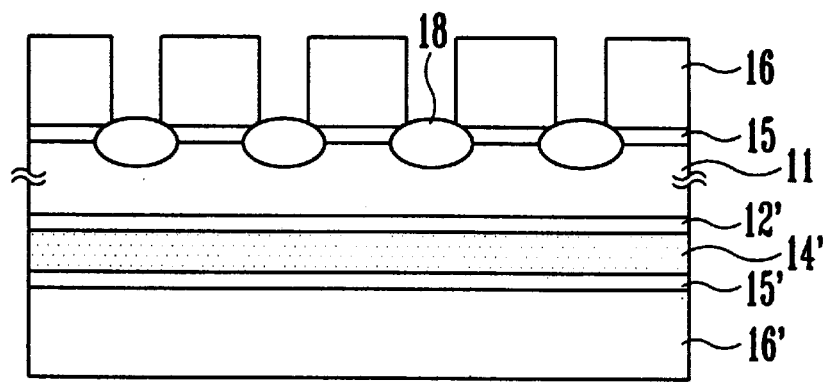

FIG. 4g is a cross section after an oxidation is carried out to grow a field oxide 18 in each of the regions uncovered with the nitride.

Figure 4H:
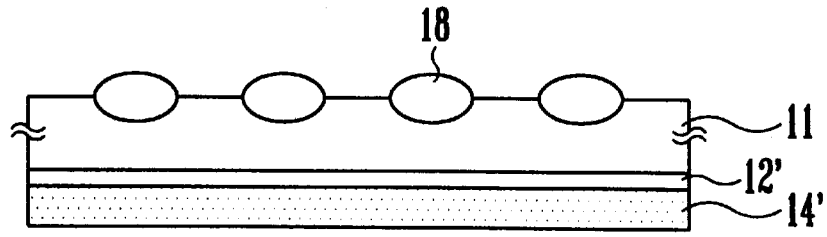

FIG. 4h is a cross section after the remaining nitrides 16 and 16' and the pad oxides 15 and 15' are eliminated in a wet-etch process.

In FIG. 5, there is illustration of a modified LOCOS process according to the present invention, in which the modified LOCOS is processed after completing FIG. 4f. Herein, the polysilicon on the back side of wafer is omitted throughout FIG. 5.

Figure 5A:
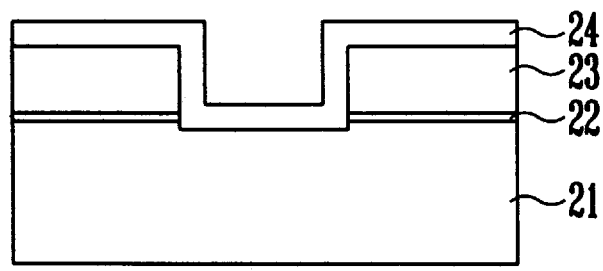
FIGS. 5a through 5d are schematic cross sectional views showing a modified process of making a field oxide after the deposition of a polysilicon layer over the back side of a wafer, in accordance with the present invention.

Initially, a pad oxide 22 and a first nitride 23 are sequentially laminated over a wafer 21 and both locally removed by an etching process, to form an element isolation mask, followed by the deposition of a second nitride 24 of a predetermined thickness over the resulting structure, as shown in FIG. 5a.

Figure 5B:
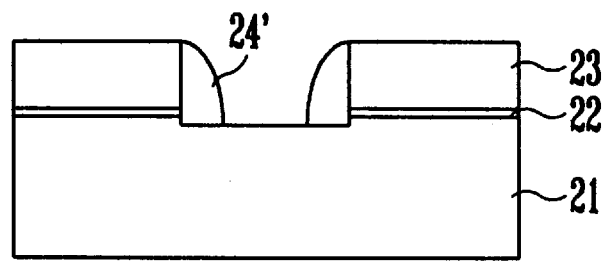

FIG. 5b is a cross section after the whole surface of the second nitride is etched without any mask, to form a second nitride spacer 24' at the sidewall of the first nitride 23.

Figure 5C:
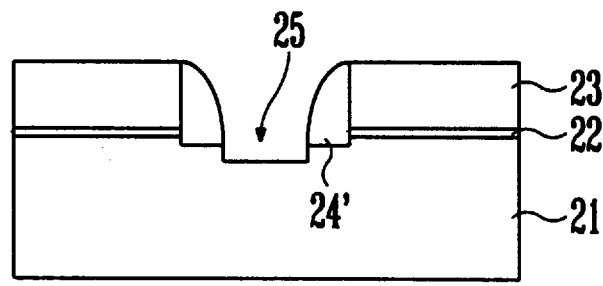

FIG. 5c is a cross section after the wafer 21 is etched out down to a predetermined thickness at its exposed region to form a groove 25.

Figure 5D:
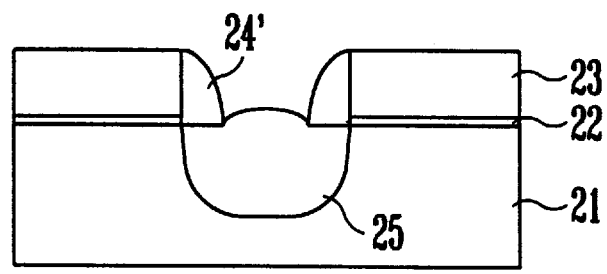

Fig. 5d is a cross section after the wafer is oxidized at the exposed region to grow a field oxide 26, filling the groove.

Figure 6A:
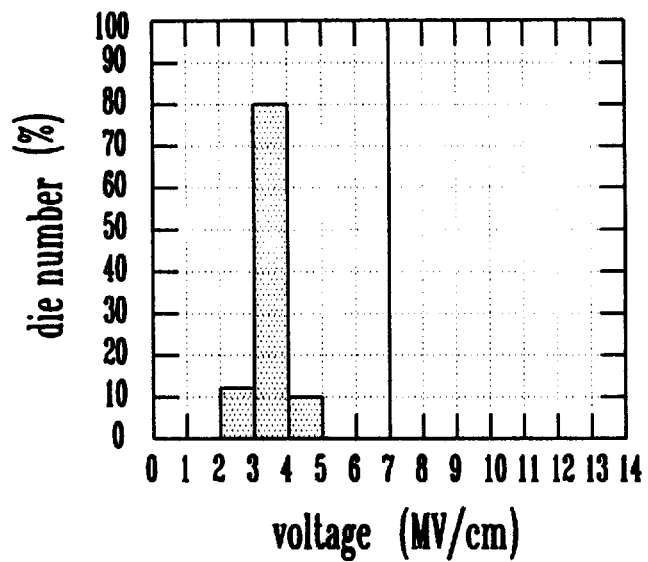
FIGS. 6a and 6b show a property in breakdown voltage of a gate oxide on a wafer on the back side of which a polysilicon layer is formed and not formed, respectively.
Figure 6B:
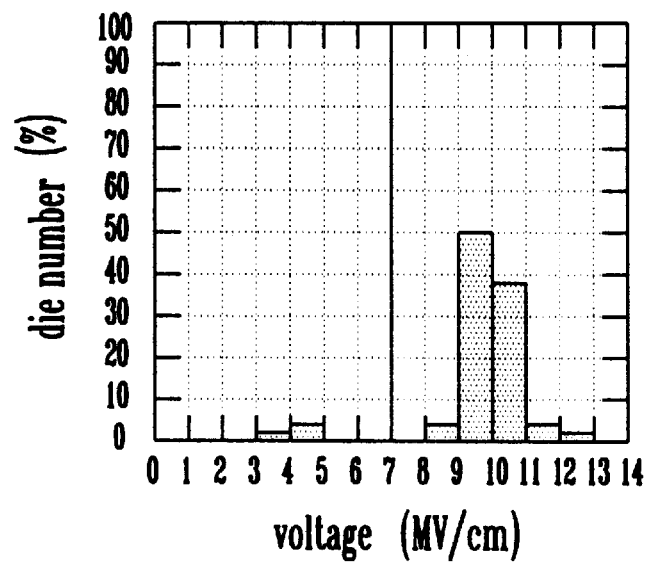

Now, turning to FIG. 6, there is a comparison between a field oxide made by the element isolation process illustrated in FIG. 5 and a conventional one, both being obtained in the state that the nitride 23 is 2,500 Angstrom thick. In FIG. 6, the failure distribution of gate oxides is shown: FIG. 6a is a conventional technique and the gate oxides tested are made in the absence of polysilicon layer on the back side of the wafer; FIG. 6b is the present invention and the gate oxides tested are made in the presence of polysilicon layer on the back side of the wafer.

From these data, the gate oxide of the conventional technique has a low breakdown voltage which does not exceed 7 MV/cm whereas most of the dies of the present invention have a breakdown voltage greater than 7 MV/cm. This advantage of the present invention is attributable to the fact that the compressive stress of the polysilicon complementarily interacts with the tensile stress of the nitride in the back side of wafer, reducing the wafer warpage.

As described before, wafer warpage is minimized by laminating a polysilicon layer and a nitride over the back side of a wafer in such a way that the compressive stress of the polysilicon layer relieves the tensile stress of the nitride, according to the present invention. Thus, even though a thick nitride is formed to shorten the bird's beak by an element isolation process of LOCOS, the gate oxide obtained can maintain excellent properties on 200 mm or larger wafers, according to the present invention.

Many modifications and variations of the present invention are possible in light of the above teachings. Therefore, it is to be understood that within the scope of the appended claims, the invention may be practiced otherwise than as specifically described.

What is claimed is:

1. A method for making a field oxide of a semiconductor device, comprising the steps of:

depositing an oxide layer and a material layer having compressive stress over the front side and the back side of a wafer;

removing only the material layer and the oxide layer over the front side;

laminating a pad oxide and a nitride over the front side and the back side of the wafer;

etching the nitride and pad oxide selectively at a predetermined field region over the front side of the wafer; and oxidizing the wafer at the field region, to grow a field oxide, whereby wafer warpage is minimized by laminating the material layer and the nitride over the back side of a wafer in such a way that the compressive stress of the material layer relieves the tensile stress of the nitride.

2. A method in accordance with claim 1, wherein said material layer is formed of polysilicon.

3. A. A method in accordance with claim 2, wherein said polysilicon is deposited at a thickness of about 500–3,000 Angstrom in a low pressure chemical vapor deposition process.

4. A method for making a field oxide of a semiconductor device, comprising the steps of:

depositing an oxide layer and a material layer having compressive stress over the front side and the back side of a wafer;

removing only the material layer and the oxide layer over the front side;

laminating a pad oxide and a nitride over the front side and the back side of the wafer;

etching the nitride and pad oxide selectively at a predetermined field region over the front side of the wafer;

forming a spacer at the side wall of the nitride and etching the wafer at the exposed field region to form a groove; and oxidizing the wafer at the field region, to grow a field oxide, whereby wafer warpage is minimized by laminating the material layer and the nitride over the back side of a wafer in such a way that the compressive stress of the material layer relieves the tensile stress of the nitride.

5. A method in accordance with claim 4, wherein said material layer is formed of polysilicon.

6. A method for making a field oxide of a semiconductor device comprising the steps of:

depositing an oxide layer and a polysilicon over the front side and the back side of the wafer;

removing only the polysilicon layer and the oxide layer over the front side;

laminating a pad oxide and a nitride over the front side and the back side of the wafer;

etching the nitride and pad oxide selectively at a predetermined field region over the front side of the wafer; and oxidizing the wafer at the field region to grow a field oxide, whereby wafer warpage is minimized by laminating the polysilicon layer and a nitride over the back side of a wafer in such a way that the compressive stress of the polysilicon layer relieves the tensile stress of the nitride.

* * * * *